United States Patent [19]
Inoue et al.

[11] Patent Number: 5,841,794
[45] Date of Patent: *Nov. 24, 1998

[54] ERROR CORRECTION PROCESSING METHOD AND APPARATUS FOR DIGITAL DATA

[75] Inventors: Takao Inoue; Tadaaki Yoshinaka; Fumiaki Henmi; Minoru Kawahara, all of Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 374,638

[22] PCT Filed: May 27, 1994

[86] PCT No.: PCT/JP94/00844

§ 371 Date: Mar. 2, 1995

§ 102(e) Date: Mar. 2, 1995

[87] PCT Pub. No.: WO94/28546

PCT Pub. Date: Dec. 8, 1994

[30] Foreign Application Priority Data

May 28, 1993 [JP] Japan ................................. 5-127606

[51] Int. Cl.$^6$ ................................................ H03M 13/00
[52] U.S. Cl. ........................ 371/37.4; 371/40.16; 360/47; 360/53
[58] Field of Search ................................. 371/37.4, 37.1, 371/37.7, 38.1, 40.11, 40.14, 40.15, 40.16, 40.17, 40.18, 37.01, 37.8; 360/39–54

[56] References Cited

FOREIGN PATENT DOCUMENTS

| | | |
|---|---|---|
| 60-173774 | 9/1985 | Japan . |
| 62-38510 | 2/1987 | Japan . |
| 62-291222 | 12/1987 | Japan . |
| 63-26868 | 2/1988 | Japan . |
| 2-42686 | 2/1990 | Japan . |
| 4-212584 | 8/1992 | Japan . |
| 5-2835 | 1/1993 | Japan . |
| 5-63588 | 3/1993 | Japan . |

*Primary Examiner*—Reba I. Elmore
*Assistant Examiner*—Thomas E. Brown
*Attorney, Agent, or Firm*—Frommer Lawrence & Haug, LLP; William S. Frommer

[57] ABSTRACT

A digital data error correction processing method and apparatus suited for high density recording in a high definition VTR etc. When the number of tracks per field is N, the digital data recorded, for example, the video signals, are given at least 1/N outer codes for each block in the block outer code ECC circuit (4A). Further, the outer codes and inner codes are made product codes in configuration, the inner codes are added at the block inner code decoding circuit (14A), and the outer codes among the double construction error correcting codes are dispersed over one field's worth of N number of tracks to be recorded on a magnetic tape (1).

25 Claims, 11 Drawing Sheets

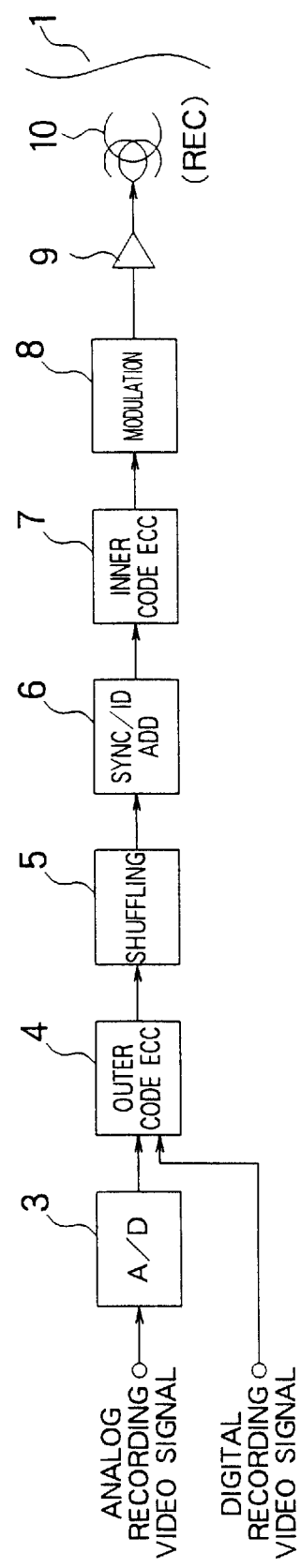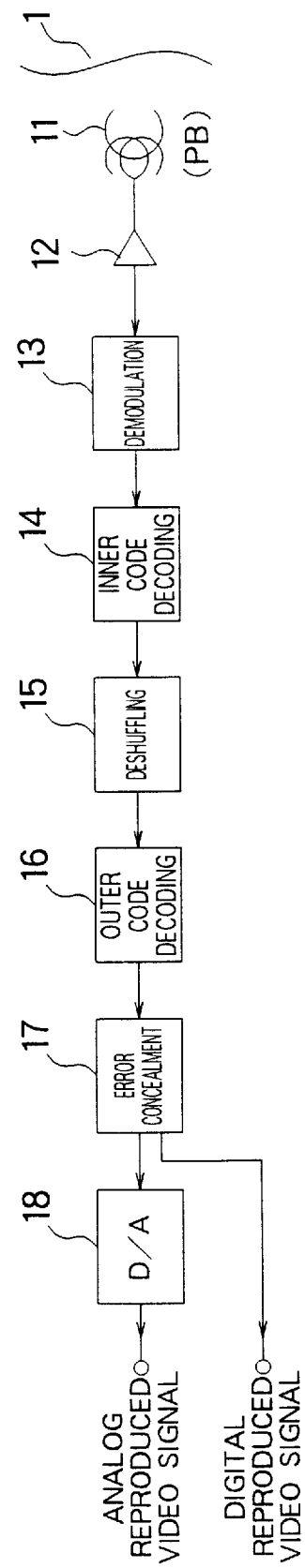

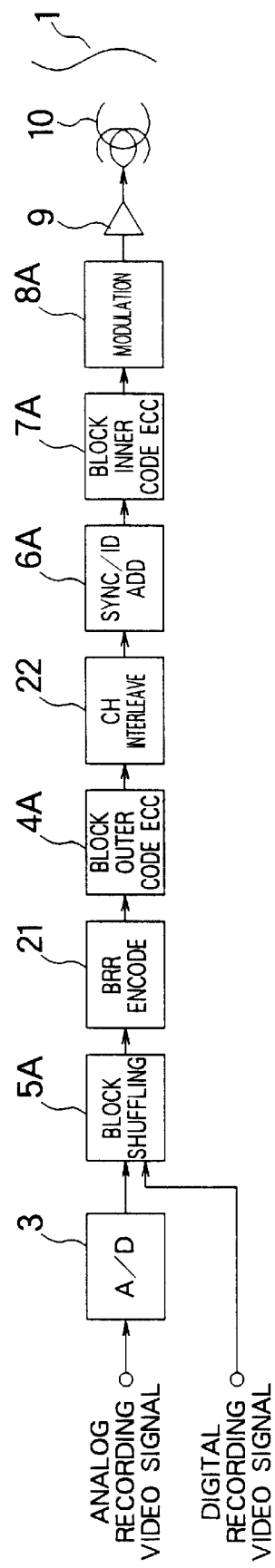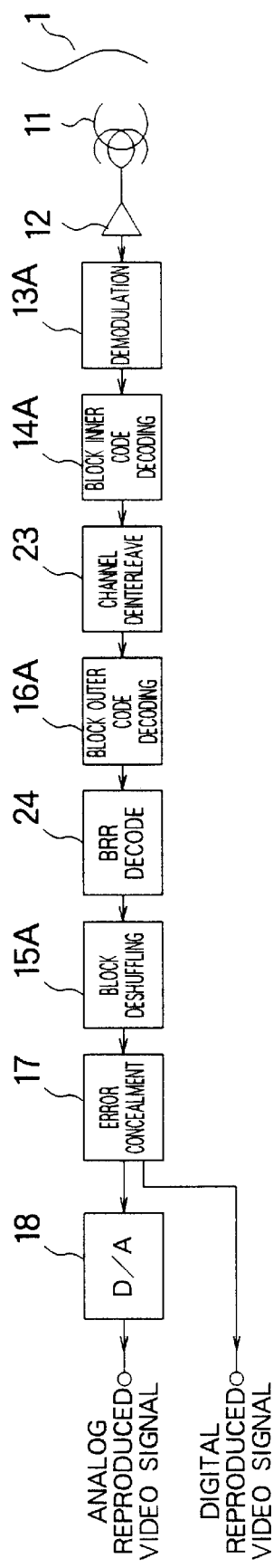

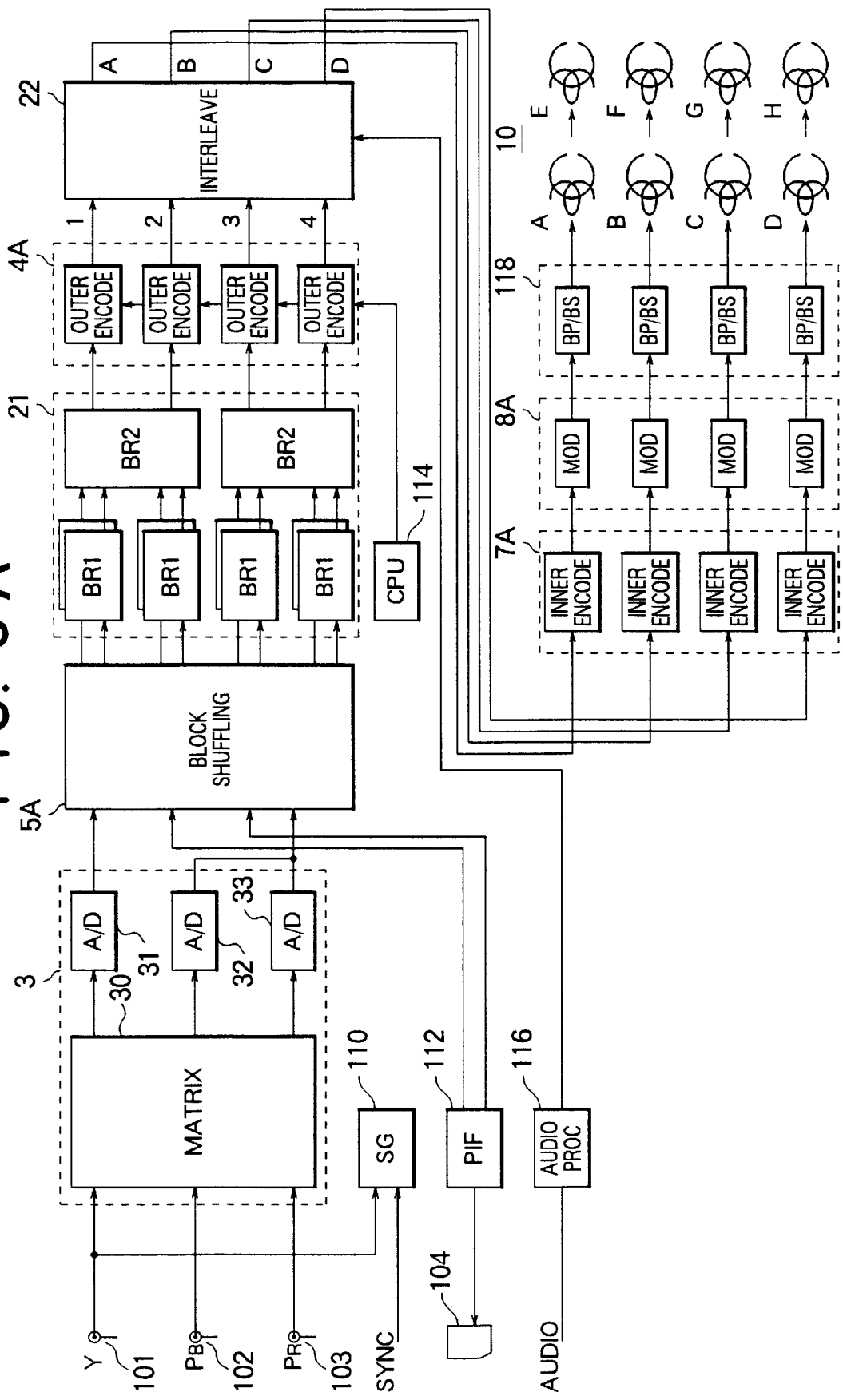

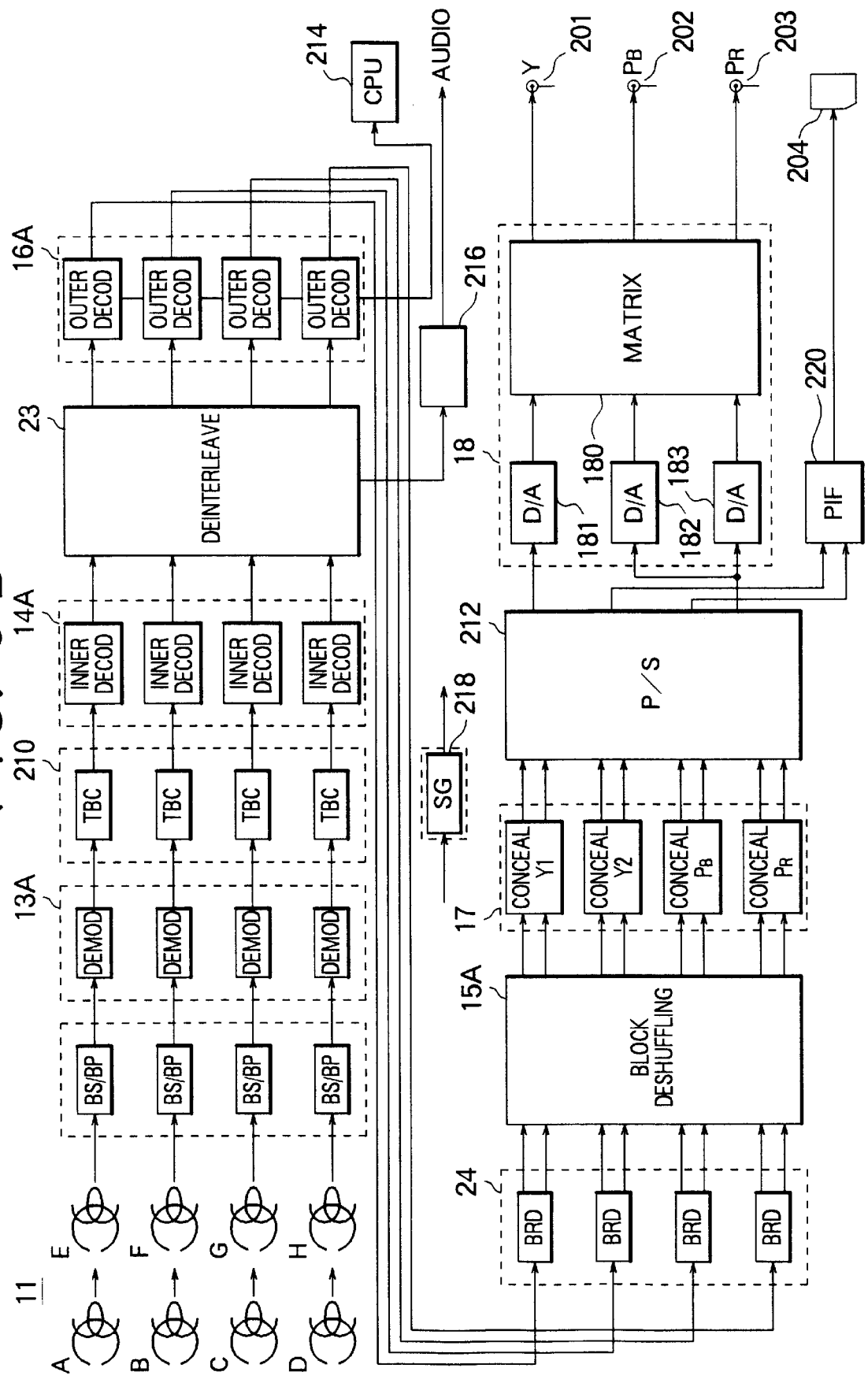

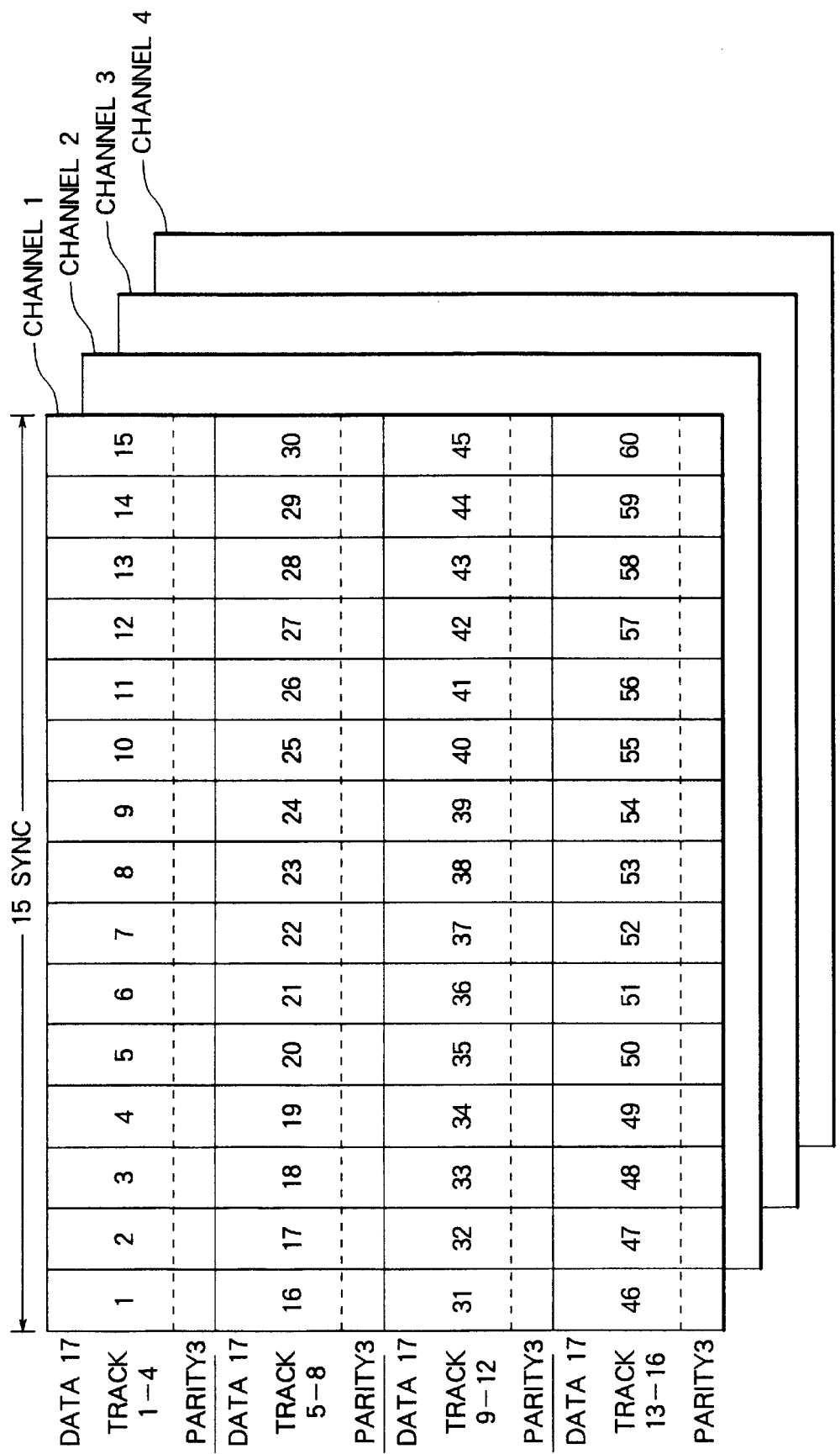

FIG. 10

CHANNEL 1

15 SYNC

| | A1 | A2 | A3 | A4 | A5 | B1 | B2 | B3 | B4 | B5 | C1 | C2 | C3 | C4 | C5 |
|---|---|---|---|---|---|---|---|---|---|---|---|---|---|---|---|
| PARITY 2 | P1-1 | P1-2 | P1-3 | P1-4 | P1-5 | P1-6 | P1-7 | P1-8 | P1-9 | P1-10 | P1-11 | P1-12 | P1-13 | P1-14 | P1-15 |
| | D1 | D2 | D3 | D4 | D5 | A6 | A7 | A8 | A9 | A10 | B6 | B7 | B8 | B9 | B10 |
| | P1-16 | P1-17 | P1-18 | P1-19 | P1-20 | P1-21 | P1-22 | P1-23 | P1-24 | P1-25 | D1-1 | D1-2 | D1-3 | D1-4 | D1-5 |
| | C6 | C7 | C8 | C9 | C10 | D6 | D7 | D8 | D9 | 10D | A11 | A12 | A13 | A14 | A15 |
| | D1-6 | D1-7 | D1-8 | D1-9 | D1-10 | D1-11 | D1-12 | D1-13 | D1-14 | D1-15 | D1-16 | D1-17 | D1-18 | D1-19 | D1-20 |
| DATA 17 | --- | --- | --- | --- | --- | --- | --- | --- | --- | --- | --- | --- | --- | --- | --- |
| | D | D | D | D | D | A | A | A | A | A | B | B | B | B | B |
| | D1- | D1- | D1- | D1- | D1- | D1- | D1- | D1- | D1- | D1- | D1- | D1- | D1- | D1- | D1- |
| | C | C | C | C | C | D | D | D | D | D | A | A | A | A | A |
| | P1-31 | P1-32 | P1-33 | P1-34 | P1-35 | P1-36 | P1-37 | P1-38 | P1-39 | P1-40 | P1-26 | P1-27 | P1-28 | P1-29 | P1-30 |
| PARITY 1 | B | B | B | B | B | | | | | | D | D | D | D | D |
| | P1-31 | P1-32 | P1-33 | P1-34 | P1-35 | P1-36 | P1-37 | P1-38 | P1-39 | P1-40 | P1-41 | P1-42 | P1-43 | P1-44 | P1-45 |

ERROR CORRECTION PROCESSING METHOD AND APPARATUS FOR DIGITAL DATA

TECHNICAL FIELD

The present invention relates to an error correction processing method and apparatus, for example, the present invention relates to a method for improving the error correcting ability in signal processing in a digital video signal recording and reproduction apparatus which records and reproduces video signals at a high density in block units.

BACKGROUND ART

As one conventional apparatus which performs processing for error correction, a digital video tape recording and reproduction apparatus (digital VTR) will be described.

When a digital VTR records, it adds error correction codes to the video signals and records the result on magnetic tape. When reproducing recorded video signals, it processes the reproduced signals read from the magnetic tape using the error correction codes to correct any errors in the reproduced video signals.

In a digital VTR, sometimes complex error occurs comprising a mixture of random errors occurring due to thermal noise of the recording and reproduction amplifiers, dust adhering to the magnetic tape, etc. and burst errors occurring due to scratches made along the running direction of the magnetic tape etc.

As such error correction codes, there are known error correction codes using inner codes and error correction codes using outer codes. In general, inner codes are defined in the lateral direction of the video signal array, outer codes are defined in the longitudinal direction, and the overall error correction codes are computed in the lateral direction and longitudinal direction to comprise product codes.

The inner codes comprise the error correction codes between data which are relatively close in the recording pattern. Inner codes are considered effective for random errors.

The outer codes comprise the error correction codes for data which are as far apart as possible in the recording pattern. Outer codes are considered effective for burst-like errors such as for example where the video signals are continuously lost due to scratches on the magnetic tape.

FIGS. 1A and 1B are views of the configuration of a conventional digital VTR. FIG. 1A shows the recording system of the digital VTR, while FIG. 1B shows the reproduction system of the digital VTR.

The recording system for a digital VTR shown in FIG. 1A includes an A/D converter 3, an outer code error correction code (ECC) processing circuit 4, a shuffling circuit 5, a synchronization signal and index (ID) signal adding circuit 6, an inner code ECC circuit 7, a modulation circuit 8, a recording amplification circuit 9, and a recording head unit 10.

The reproduction system of the VTR shown in FIG. 1B includes a reproduction head unit 11, a reproduction amplification circuit 12, a demodulation circuit 13, an inner code decoding circuit 14, a deshuffling circuit 15, an outer code decoding circuit 16, an error concealment processing circuit 17, and a D/A converter 18.

The VTR shown in FIG. 1A and FIG. 1B records video signals consisting of component video signals comprised of red (R), green (G), and blue (B) signals or of luminance signals Y, first chrominance signals $P_B$, and second chrominance signals $P_R$ on the magnetic tape 1 and reproduces those component signals. In the following description, as the component video signals, illustration will be made of the case of recording and reproduction of luminance signals Y, first chrominance signals $P_B$, and second chrominance signals $P_R$ on and from a magnetic tape 1.

The operation of the recording system of the digital VTR shown in FIG. 1A will be explained next.

When the recording video signals are analog signals in format, the analog video signals are converted to digital video signals at the A/D converter 3 and then supplied to the outer code ECC circuit 4. When the video signals are digital signals in format, they are directly supplied to the outer code ECC circuit 4 without A/D conversion.

The outer code ECC circuit 4 computes the outer codes for error correction at the time of reproduction and adds the outer codes to the recording video signals in pixel units.

The shuffling circuit 5 disperses the effects of the code errors, improves the correcting ability, and lightens the reduction in image quality due to uncorrected errors. That is, the shuffling circuit 5 rearranges in pixel units the video signals given the outer codes from the outer code ECC circuit 4 so as to disperse burst errors at the time of reproduction over the series of outer codes.

The synchronization signal and index (ID) signal adding circuit 6 adds to the shuffled video signals synchronization signals serving as the reference for reading the video signals at the time of reproduction and the addresses showing the numbers of the blocks, the field information, and other indexes (ID).

The inner code ECC circuit 7 adds to the data output from the synchronization signal and ID signal adding circuit 6 the inner codes for error correction.

The modulation circuit 8 modulates the data given the inner codes at the inner code ECC circuit 7 to a series of data matching the magnetic recording characteristics of the magnetic tape 1 and the recording head unit 10. As the method for modulation in the modulation circuit 8, for example, use may be made of scramble NRZ modulation, Miller's square ($M^2$) modulation, etc.

The modulated video signals are amplified at the recording amplification circuit 9 and are recorded on the magnetic tape 1 through the recording head unit 10.

The operation of the reproduction system of the digital VTR shown in FIG. 1B will be explained below. The operation of the digital VTR reproduction system is basically opposite to the operation of the VTR recording system shown in FIG. 1A.

The video signals recorded on the magnetic tape 1 are read out through the reproduction head unit 11 and amplified by the reproduction amplification circuit 12.

The demodulation circuit 13 returns the video signals to the form before modulation by the modulation circuit 8 by performing processing to reverse the modulation, that is, demodulation, in pixel units and thereby restore the recording video signals.

The inner code decoding circuit 14 uses the inner codes to correct errors in the demodulated video signals from the demodulation circuit 13 in pixel units. The error correction using the inner codes mainly corrects random errors.

The deshuffling circuit 15 performs processing reverse to the shuffling performed by the shuffling circuit 5 in the VTR recording system (deshuffling processing) in pixel units so as to return the video signals corrected for errors by the inner codes to an array of video signals corresponding to that before the shuffling processing.

The outer code decoding circuit 16 decodes the video signals deshuffled at the deshuffling circuit 15 to the video signals of the form before processing by the outer code ECC circuit 4 in the VTR recording system.

There are many cases where errors cannot be completely corrected even with the above inner code decoding circuit 14 and outer code decoding circuit 16. The error concealment circuit 17 performs concealment processing for concealing the errors using the video signals around the pixels with the remaining errors and at the same positions in the former and later fields or the previous frame.

In this description, the term "error code correction (ECC)" and the term "error concealment" are distinguished from each other as explained above. Error code correction refers to the ECC processing in the circuits 4 and 7 and the circuits 14 and 16 using the outer codes and inner codes. On the other hand, error concealment refers to the concealment processing for concealing errors using the video signals around the pixels with the remaining errors and at the same positions in the former and later fields or the previous frame.

The video signals whose errors are concealed at the error concealment circuit 17 are output as they are as reproduced digital video signals or else are converted to analog video signals through the D/A converter 18 and output as reproduced analog video signals.

Using the above-mentioned configuration of an error code correction (ECC) in a VTR, errors of from 5 to 7 percent of the overall recording data may be corrected by the inner code decoding circuit 14 and the outer code decoding circuit 16. Errors beyond that are handled by the error concealment circuit 16. For example, when as much as one track of data is lost, the error concealment circuit 17 operates to conceal the errors. As a result, it is possible to obtain a reproduced image almost no different from the original.

The ECC is constituted so as to enable positive concealment of large burst errors of as much as one track. Accordingly, the ECC blocks are configured in track units or head units.

In the above digital VTR, the video signals to be recorded are processed in pixel units. The errors occurring at the time of reproduction, as mentioned above, are corrected by the inner code decoding circuit 14 and the outer code decoding circuit 16. Even if data which cannot be corrected occur, since the data are dispersed over several tracks in advance by the shuffling processing by the shuffling circuit 5 in the recording system, the erroneous data are dispersed on the screen and do not stand out.

Further, by this dispersion by the shuffling in advance, since there is a high possibility (probability) that the data around the erroneous data are not mistaken, error concealment processing in the error concealment circuit 17 is possible and therefore it is possible to obtain a reproduced image almost no different from the original even if the reproduced signals are partially processed to conceal errors.

As explained above, a conventional digital VTR performed the error correction processing in pixel units. It did not perform error correction processing in block units corresponding to the block unit image processing in the later mentioned high definition systems etc.

Further, the error correction code processing in the above-mentioned inner code decoding circuit 14 and outer code decoding circuit 16 did not correct errors dispersed over several tracks.

In a digital VTR using image compression technology, the image compression processing is performed in units of blocks of for example 8 samples×8 lines, so when errors occur at the time of reproduction and the errors cannot be corrected, those errors are propagated in the 8 sample×8 line block processing unit and the data of the block as a whole is lost.

Accordingly, in error concealment processing, it is necessary to conceal errors in data not in the above-mentioned pixel units, but block units and the problem was therefore encountered of extreme complexity and difficulty in error concealment processing.

Considering the high density recording in high definition digital VTRs and the like, further, the situation is encountered of a shorter recording wavelength and a reduced track pitch. A reduced track pitch means narrower tracks and makes it necessary for the heads to accurately trace the recorded tracks at the time of reproduction.

Further consider the editing in a digital VTR.

In the insert recording illustrated in FIG. 2, magnetic tape which has already been recorded on as shown by the thin lines is erased from one position to another position by a flying erase head, then is recorded on with new video signals by a recording head. Normally, the track pattern on the magnetic tape at the portion continuously recorded consists, as shown by the thin lines, of tracks arranged neatly at equal intervals by the track pitch TP. When recording later by editing, however, as shown by the thick lines, deviation occurs in the intervals of the track pattern at the starting position A of the later recorded portion and the end position B. As a result, some video data is left unerased at the narrow track TRA at the starting position A, while the track TRB at the end position B in the illustrated example becomes extremely fine in track width, that is, about half of the track pitch TP.

The size of the discontinuity is related to the mechanical components, in particular, the physical precision of the flying erase head, the mounting precision, or how the recording head can be controlled by the servo circuit to the positions where the track patterns are continuously constituted at the time of editing.

This means that in high density systems in digital VTRs, when the tracks becomes narrow as the track TRB shown in FIG. 2, there are limits in respect to suppression of manufacturing variations etc. even with accurate, precision processing. Further, the problem is encountered of the price of the apparatus rising in order to obtain accuracy and precision.

When reproducing from such an edited magnetic tape, part of just one track of the data recorded before editing is erased or overwritten at the starting position A and end position B of the editing point shown in FIG. 2, so the width of the track becomes narrower, i.e., so-called "track-width thinning" occurs, and the error rate of the reproduced data rises. In extreme cases, for example, sometimes one track of data is lost at the portion of the track TRB.

According, error correction which can handle such situations has been demanded.

DISCLOSURE OF THE INVENTION

An object of the present invention is to provide a digital video signal recording and reproduction apparatus which can improve the error correcting ability in the case of high density recording of digital video signals on narrow tracks using image compression technology.

Another object of the present invention, in consideration of editing processing, is to provide a digital video signal recording and reproduction apparatus with a high reliability which has the ability to correct as much as track units of errors.

Still another object of the present invention is to provide an error correction coding and decoding processing apparatus for digital data.

Yet still another object of the present invention is to provide an error correction coding method and decoding method for digital data which can be applied to the above apparatus.

In an example of the error correction decoding processing apparatus for digital data of the present invention, for example, taking the case of a digital VTR, when the number of tracks per field is N, the error correction codes (ECC) are configured as product codes of inner codes and outer codes, at least 1/N outer codes are added to the recording video data, and the outer codes in doubly added error correction codes are dispersed over one field's worth of N number of tracks to improve the error correction coding ability.

In a digital VTR, to realize error correction in track units, at least the same number of parity-check codes (outer codes) as the number of data recorded on the tracks to be corrected by the error correction out of all of the data constituting the ECCs is necessary. Further, considering the editing processing in a digital VTR, it is necessary that the ECC blocks be constituted by the smallest editing units. Addition of outer code parity-check codes to the video signals in this way increases the rate (redundancy) of the number of codes for a number of signals, but in high definition VTR etc., the number of tracks per field becomes large so the rate of outer codes (redundancy) per number of signals becomes appropriate. Accordingly, it becomes possible to improve the error correcting ability by adding outer codes.

That is, when recording digital video data on a recording medium by a plurality of heads, by configuring the ECCs so as to enable correction of errors for the same or greater number of tracks as the number of tracks to be recorded by one head per field, it is possible to restore the video data by error correction even in the case of clogging by one head.

Accordingly, according to the present invention, there is provided an error correction coding processing method for digital data characterized by adding at least 1/N outer codes to the digital recording data, where the number of tracks per field is N, configuring the inner codes and outer codes as product codes, and dispersing the outer codes in the doubly-added error correction codes over one field's worth of N number of tracks.

Preferably, the digital data is comprised of units of block of sizes of n×m and the error correction code processing is performed in such block units.

Further, according to the present invention, provision is made of a method of restoring data processed by the above error correction coding, that is, an error correction decoding processing method comprising performing a first step of error correction in block units using the added inner codes, performing a second step of error correction in block units using the added outer codes, and performing concealment processing for concealing the errors remaining after error correction.

Further, according to the present invention, there is provided an error correction coding method for digital data characterized by configuring as product codes the inner codes and outer codes serving as error correction codes, adding the error correction codes doubly to the digital data, and dispersing the outer codes in the added error correction codes among one processing unit's worth of a plurality of sequences of data.

The error correction coding processing method of data is not limited to digital video signals and audio signals, but preferably the digital data are high definition digital recording and reproduction signals, the unit of processing is a field, and the plurality of sequences is a plurality of tracks.

According to the present invention, there is provided a digital data error correction coding method which performs error correction coding of digital data using inner codes and outer codes constituting product codes, said digital data coding method comprising the following steps:
a block shuffling step of shuffling the data every block comprised of (m×n) number of data so as to disperse the effects of errors occurring in the data,
a block outer code adding step of adding at least 1/N (wherein N is the number of tracks per field of data) outer codes to the data for every block of the shuffled data,
a channel data dispersion step of dispersing the data to which the outer codes have been added among a plurality of channels, and
a block inner code adding step of adding inner codes for every block of the dispersed data.

Preferably, provision is made after the block shuffling step of a bit rate reduction step of compressing by a predetermined compression rate the data shuffled in blocks, and, in the block outer code adding step, outer codes are added for every block of the data compressed at the bit rate reduction step.

Further, according to the present invention, there is provided an apparatus for working the digital data error correction coding method mentioned above, that is, a digital data coding apparatus comprising:
block shuffling means for shuffling the the data every block comprised of (m×n) number of data so as to disperse the effects of errors occurring in the data,
block outer code adding means for adding at least 1/N (wherein N is the number of tracks per field of data) outer codes to the data for every block of the shuffled data,
channel data dispersion means for dispersing the data to which the outer codes have been added among a plurality of channels, and
block inner code adding means for adding inner codes for every block of the dispersed data.

Preferably, provision is made between the block shuffling means and the block outer code adding means of a bit rate reduction means for compressing by a predetermined compression rate the data shuffled in blocks, and the block outer code adding means adds outer codes for every block of the data compressed by the bit rate reduction means.

Preferably, according to the present invention, there is provided a digital data recording apparatus including a recording means for recording coded data on the recording medium after the block inner code decoding means.

Specifically, the recording medium is a magnetic tape and the recording means has a modulation means and magnetic head unit.

Preferably, the outer codes are disposed at the two ends of the data so that the outer codes are recorded at the ends of the magnetic tape and the data are recorded at the center of the tape.

More preferably, the magnetic head unit is comprised of $\underline{n}$ number of heads disposed at equal intervals and $\underline{n}$ number of heads disposed close to those heads, the magnetic heads are comprised to turn two times to record one field of data on said magnetic tape, and said number N of tracks is defined as N=4×n.

Preferably, the channel dispersion is performed to distribute the data substantially equally over all the channels.

More preferably, the digital data include high definition video signals.

Specifically, the high definition video signals are component signals comprised of three types of video components, and one field's worth of the three type of video signal components is distributed over $\underline{n}$ number of channels.

Further, according to the present invention, there is provided a digital data error correction decoding method which decodes by error correction the data obtained by shuffling the digital data using inner codes and outer codes constituting product codes for every block comprised of (m×n) number of data, adding at least 1/N (wherein N is the number of tracks per field of data) outer codes to the data for every block of the shuffled data, dispersing the data to which the outer codes have been added among a plurality of channels, and adding inner codes for every block of the dispersed data, said digital data error correction decoding method including the following steps:
a block inner code decoding step of decoding every block of the coded data using inner codes,
a channel dispersion reversing step for reversing the channel dispersion of the data decoded using the inner codes,
a block outer code decoding step of decoding every block of the channel-restored data using the outer codes,
a block deshuffling step of restoring every block of the data decoded using the outer codes to the state before the shuffling, and
an error concealment step of concealing the errors which cannot be corrected at the block inner code decoding step and the block outer code decoding step by referring to the surrounding data.

Preferably, provision is made after the block outer code decoding step of a bit rate reduction decoding step of restoring the data decoded in blocks by the outer code by a predetermined compression rate and, in the block deshuffling step, every block of the data restored at the bit rate reduction decoding step is deshuffled.

Further, according to the present invention, there is provided an apparatus for working the digital data error correction decoding method, that is, a digital data error correction decoding apparatus comprising
a block inner code decoding means for decoding every block of the coded data using inner codes,
a channel dispersion reversing means for reversing the channel dispersion of the data decoded using the inner codes,
a block outer code decoding means for decoding every block of the channel restored data using the outer codes,
a block deshuffling means for restoring every block of the data decoded using the outer codes to the state before the shuffling, and
an error concealment means for concealing the errors which cannot be corrected by the block inner code decoding means and the block outer code decoding means by referring to the surrounding data.

Preferably, provision is made between the block outer code decoding means and the block deshuffling means of a bit rate reduction decoding means for restoring the data decoded in blocks by the outer codes by a predetermined compression rate and the block deshuffling means deshuffles every block of the data restored at the bit rate reduction decoding means.

According to the present invention, there is provided a digital data reproduction apparatus comprised of the above digital data error correction decoding processing apparatus provided with a means for reading coded data from a recording medium.

Further, according to the present invention, there is provided a digital data error correction coding and decoding processing apparatus comprised of the above digital data error correction coding processing apparatus and the above digital data error correction decoding processing apparatus working together.

Further, according to the present invention, there is provided a digital data recording and reproduction apparatus comprised of the above digital data recording apparatus and the above digital data reproduction apparatus working together.

BRIEF DESCRIPTION OF THE DRAWINGS

FIG. 1A is a view of the configuration of a recording system of a conventional digital VTR.

FIG. 1B is a view of the configuration of a reproduction system of a conventional digital VTR.

FIG. 3A is a view of the configuration of a recording system of a high definition digital VTR as an embodiment of an error correction code processing apparatus of digital data of the present invention.

FIG. 3B is a view of the configuration of a reproduction system of a high definition digital VTR as an embodiment of the present invention.

FIG. 8A is a view of the detailed configuration of the circuit in a recording system of the high definition digital VTR illustrated in FIG. 3A.

FIG. 8B is a view of the detailed configuration of the circuit in a reproduction system of the high definition digital VTR illustrated in FIG. 3B.

FIG. 9 is a view of the signal format for explaining the method of processing video signals shown in FIG. 5 in the digital VTR illustrated in FIG. 8A and FIG. 8B.

FIG. 10 is a view showing another embodiment of the signal format shown in FIG. 9.

BEST MODE FOR CARRYING OUT THE INVENTION

Figure 2:
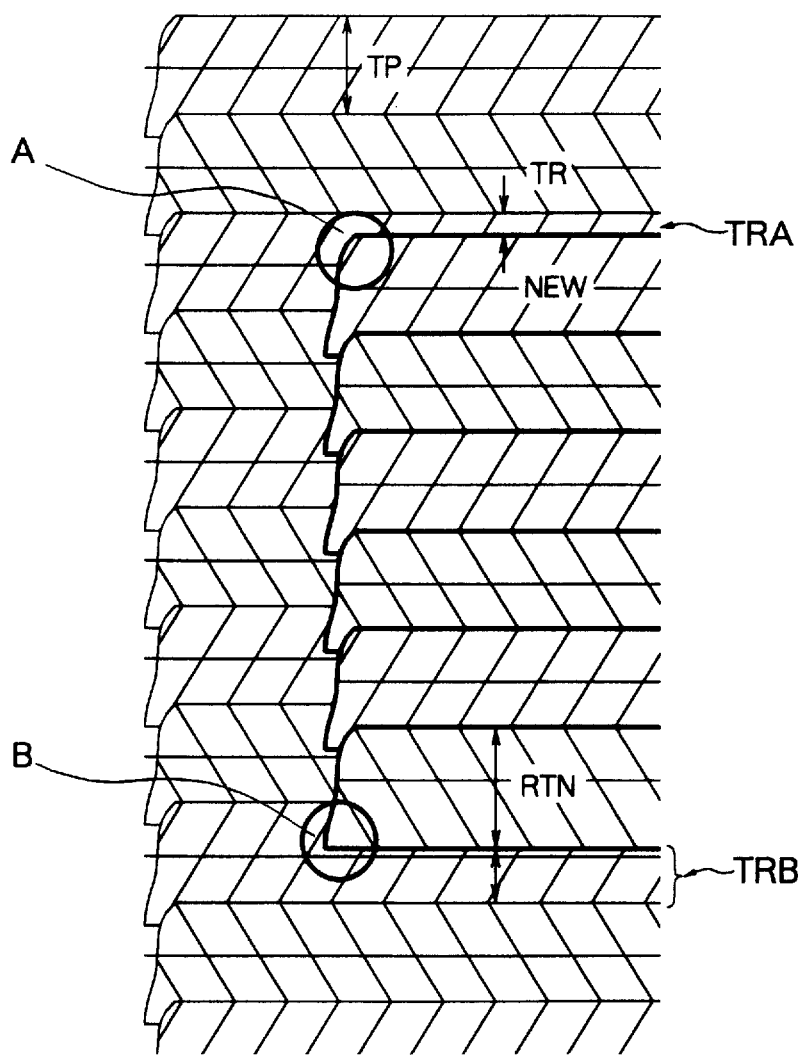
FIG. 2 is a view illustrating the thinning of a track in the case of erasing recording data by a flying erase head from one position to another position on a magnetic tape already recorded on in inserting recording.

FIG. 3A and FIG. 3B are views of the configuration of a high definition digital VTR of an embodiment of an error correction decoding processing apparatus of digital data of the present invention. FIG. 3A is a view of the configuration of a recording system of the digital VTR, and FIG. 3B is a view of the configuration of the reproduction system of the digital VTR.

The recording system of the digital VTR shown in FIG. 3A includes an A/D converter 3, a block shuffling circuit 5A, a bit rate reduction (BRR) coding circuit 21, a block outer code ECC circuit 4A, a channel interleave circuit 22, a synchronization signal and ID signal adding circuit 6A, a block inner code ECC circuit 7A, a modulation circuit 8A, a recording amplification circuit 9, and a recording head unit 10.

The reproduction system of the digital VTR shown in FIG. 3B includes a reproduction head unit 11, a reproduction amplification circuit 12, a demodulation circuit 13A, a block inner code decoding circuit 14A, a channel deinterleave circuit 23, a block deshuffling circuit 15A, a block outer code decoding circuit 16A, a bit rate reduction decoding circuit 24, a block deshuffling circuit 15A, an error concealment circuit 17A, and a D/A converter 18.

Such a high definition digital VTR records as the recording video signals component video signals comprised of red (R), green (G), and blue (B) signals or of luminance signals Y, first chrominance signals $P_B$, and second chrominance signals $P_R$ on the magnetic tape 1 and reproduces those component signals. In the following description, as the component video signals, illustration will be made of the case of recording and reproduction of luminance signals Y, first chrominance signals $P_B$, and second chrominance signals $P_R$ on and from a magnetic tape 1.

The operation of the recording system of the digital VTR shown in FIG. 3A will be explained next.

When the recording video signals are analog signals in format, the analog video signals are converted to digital video signals at the A/D converter 3 and then input to the block shuffling circuit 5A. When the video signals are digital signals in format, they are directly supplied to the block shuffling circuit 5A.

The block shuffling circuit 5A disperses the video signals in block units to separate positions, considering the outer codes added at the block outer code ECC circuit 4A. Due to this block shuffling, errors occurring spanning the video signals of one block and the video signals of the next block are dispersed and thereby the efficiency of the correction processing is improved. Further, the block shuffling circuit 5A performs dispersion processing for making the compression rates uniform for image data where the compression rate can be made extremely high due for example to being an image with little changes, such as an image of the blue sky etc., and image data where the compression rate cannot be made too high due to the image being a complicated one, when for example compressing an image in block units in the bit rate reduction coding circuit 21.

The bit rate reduction coding circuit 21 compresses in block units the video signals shuffled in block units in the block shuffling circuit 5A, that is, compresses vide signals block by block by a predetermined compression rate.

The block outer code ECC circuit 4A adds the outer codes in block units to the video signals image-compressed by the bit rate reduction coding circuit 21.

The channel interleave circuit 22 divides and distributes the outer code direction data equally among one field's worth of tracks. Details of this equal division and distribution operation are explained later.

The synchronization signal and ID signal adding circuit 6A adds to the video signals processed at the channel interleave circuit 22 the synchronization signals for the reproduction, the ID/addresses, etc.

The block inner code ECC circuit 7A adds the inner codes to the output data of the synchronization signal and ID signal adding circuit 6A.

The modulation circuit 8A modulates the video signals to which the inner codes have been added. In this example, eight-to-fourteen modulation (EFM) is performed.

The video signals modulated by the modulation circuit 8A are recorded on the magnetic tape 1 through the recording amplification circuit 9 and the recording head unit 10.

The operation of the reproduction system of the digital VTR shown in FIG. 3B will be explained below.

The video signals recorded on the magnetic tape 1 are read through the reproduction head 11 and amplified by the reproduction amplification circuit 12.

The demodulation circuit 13A performs processing opposite to the eight-to-fourteen modulation at the modulation circuit 8A in the recording system of FIG. 3A, that is, performs demodulation corresponding to the eight-to-fourteen modulation, to return the signals to the video signals before modulation at the modulation circuit 8A.

The block inner code decoding circuit 14A corrects errors in the demodulated video signals from the demodulation circuit in block units using the inner codes.

The channel deinterleave circuit 23 performs processing opposite to the equal division and distribution performed at the channel interleave circuit 22 in FIG. 3A.

The block outer code decoding circuit 16A restores the video signals based on the outer codes added at the block outer code ECC circuit 4A in FIG. 3A.

The bit rate reduction (BRR) decoding circuit 24 performs image data expansion processing opposite to the image data compression processing performed at the bit rate reduction coding circuit 21 in FIG. 3A.

The block deshuffling circuit 15A performs processing opposite to the shuffling performed at the block shuffling circuit 5A in FIG. 3A, that is, performs block deshuffling processing.

The error concealment circuit 17A performs error concealment processing to conceal the errors which could not be corrected by the outer codes. That is, the error concealment circuit 17A performs error concealment processing to conceal errors using the video signals around the pixels with the remaining errors and at the same positions in the former and later fields or the previous frame.

The video signals processed for error concealment at the error concealment circuit 17A are either output as they are as reproduced digital video signals or else are converted into analog video signals through the D/A converter 18 and output as reproduced analog video signals.

Figure 4:
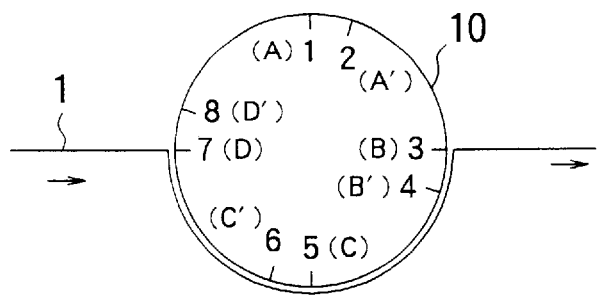
FIG. 4 is a schematic view of a multiple rotary head unit in the digital VTR shown in FIG. 3A and FIG. 3B.

FIG. 4 shows the schematic cross-sectional configuration of the recording head unit 10.

The recording head unit 10 is provided with eight heads 1 to 8 (or heads A, B, C, D, A', B', C', and D'). The first group of heads 1 to 4 (A, B, C, and D) are provided at equal intervals along the circumference at angular intervals of 90 degrees. The second group of heads 5 to 8 (A', B', C', and D') are also provided at equal intervals, but maintaining a predetermined angle near the heads of the first group. The recording head unit 10 in this way has an 8-head configuration. This recording head unit 10 rotates at 120 Hz. The magnetic tape is wound 180 degrees around it. With each turn, eight tracks of data are recorded on the magnetic tape 1 and with two turns 16 tracks, that is, one field of data, are recorded on the magnetic tape 1.

This embodiment is of a high definition digital VTR, so high definition TV signals of a field of 1125 scanning lines and a frequency of 60 Hz are recorded on a magnetic tape 1 by eight heads in 16 tracks per field. That is, the recording head unit 10 having eight heads rotates two times to record one field of video signals along with audio signals on the magnetic tape 1.

Figure 5:
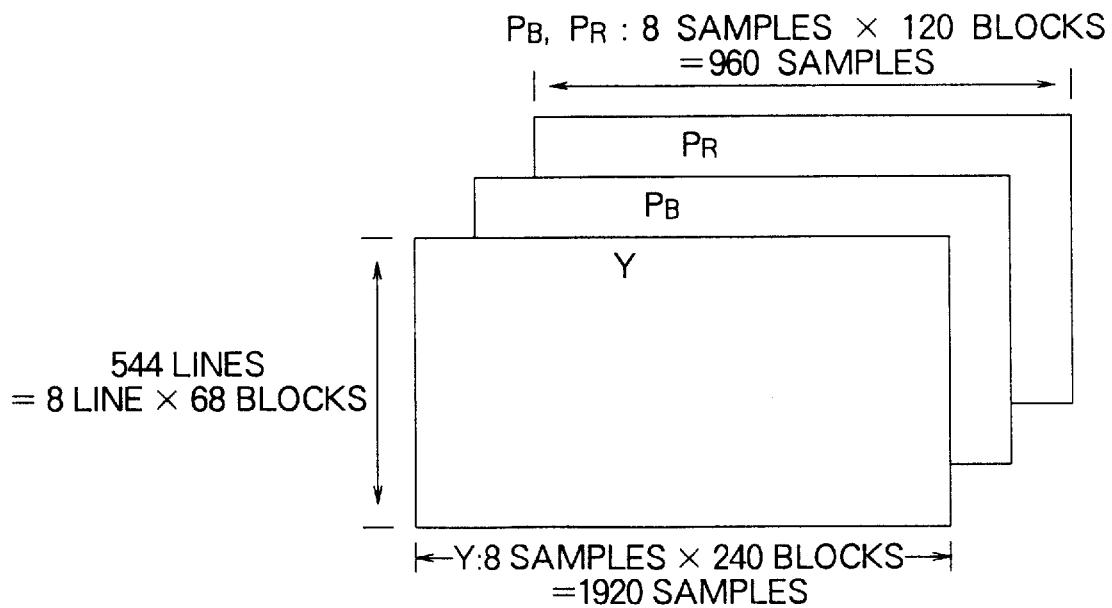
FIG. 5 is a view of the configuration of video signals processed in the digital VTR shown in FIG. 3A and FIG. 3B.

FIG. 5 shows the areas of the image recorded per field and the number of image-compressed and converted blocks per field of high definition video signals.

The high definition TV signals are component signals comprised of luminance signals Y, first chrominance signals $P_B$, and second chrominance signals $P_R$. The number of recording lines per field is 8 lines×68 blocks=544 lines. The number of recording samples for the luminance signals Y is 1920 samples=8 samples×240 blocks. The numbers of recording samples for the first chrominance signals $P_B$ and the second chrominance signals $P_R$ are half of that of the luminance signals Y, that is, 96 samples=8 samples×120 blocks. Accordingly, the total number of image-compressed and converted blocks per field is 68 blocks×(240+120+120) blocks=32,640 blocks.

In the recording system shown in FIG. 3A, the analog high definition recording component video signals are sampled and quantized at a sampling frequency of 74.25 MHz for the luminance signals Y and half of the frequency of the luminance signals Y, or a sampling frequency of 37.125 MHz, for the first chrominance signals $P_B$ and the second chrominance signals $P_R$.

The block shuffling circuit 5A processes the video data comprised of blocks of 8 samples×8 lines, to be processed for image compression at the bit rate reduction coding circuit 21, to mix and rearrange one field's worth of image-compressed and converted blocks, that is, 32,640 blocks, of luminance signals Y, first chrominance signals $P_B$ S and second chrominance signals $P_R$, shown in FIG. 5.

This block unit rearrangement performed at the block shuffling circuit 5A, as mentioned above, is designed not only to equalize the image compression rates in the bit rate reduction coding circuit 21, but also to disperse the outer codes added at the outer code ECC circuit 4A with the aim of correction of burst-like errors. Further, the block shuffling circuit 5A, as will be explained later with reference to FIG. 6 and FIG. 7A, divides the video signals shown in FIG. 5, for four-channel processing, that is, to give 32,640 blocks/4 channels=8,160 blocks per channel. The 8,160 blocks break down into 4080 blocks of luminance signals Y and 2040 blocks each of the first chrominance signals $P_B$ and the second chrominance signals $P_R$.

Figure 6:
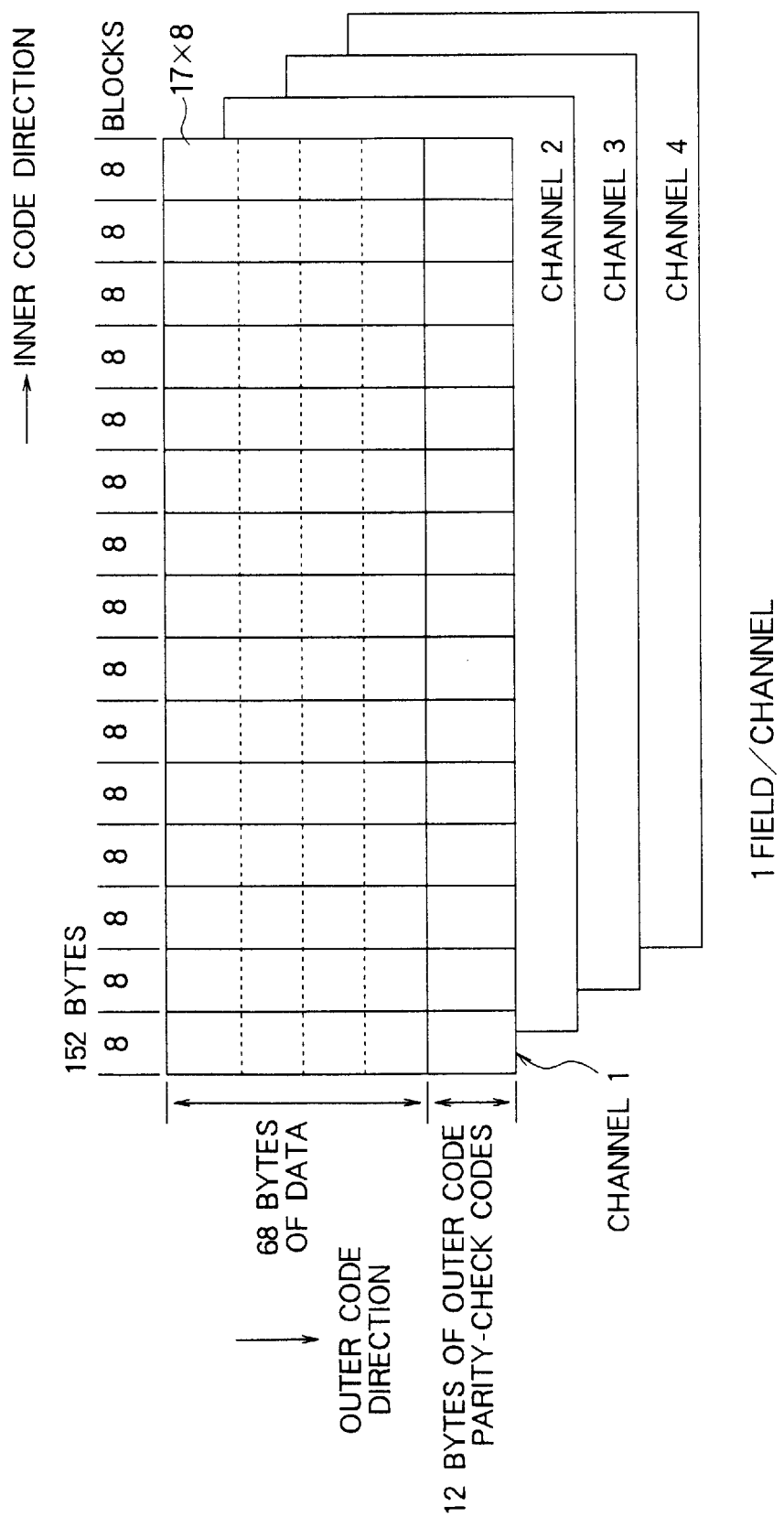
FIG. 6 is a view of the signal format for explaining the method of processing the video signals shown in FIG. 5 in the digital VTR illustrated in FIG. 3A and FIG. 3B.

FIG. 6 illustrates the four-channel configuration. The four-channel processing is for lightening the load in signal processing since the above-mentioned high definition video signals are high speed.

The bit rate reduction coding circuit 21 performs image compression on the video signals shuffled at the block shuffling circuit 5A at a compression rate of 1/3.37.

The processing at the block outer code ECC circuit 4A, the channel interleave circuit 22, and the block inner code ECC circuit 7A will be explained below.

The block outer code ECC circuit 4A and the block inner code ECC circuit 7A, as illustrated in FIG. 6, add the outer codes and inner codes to the shuffled video signals from the block shuffling circuit 5A so as to give a product code configuration of the outer codes and inner codes for the error correction.

In FIG. 6, the inner code parity-check codes are added in the lateral direction and the outer code parity-check codes are added in the longitudinal direction. These outer codes and inner codes form product codes in configuration.

Each channel of the four channels in FIG. 6 shows one field of video signals and has inner codes added in the lateral direction and outer codes in the longitudinal direction. The ECC configuration in this example is divided into 15 blocks in the lateral direction per channel. That is, the lateral direction is divided into 15 synchronization blocks of 8 bytes each. 8160 blocks/15 blocks=544 lines worth of video data, that is, 544 lines/8=68 bytes of video data, are arranged in the longitudinal direction. The size of each section in the longitudinal direction is 68 bytes/4=17 bytes. Accordingly, the size of one ECC block becomes 8×17 bytes. 12 bytes of outer code parity-check codes are added to 68 bytes of data in the longitudinal direction. The grounds for the addition of 12 bytes of outer code parity-check codes will be explained later. The outer code parity-check codes used are for example Reed-Solomon codes.

The number of bytes in the lateral direction, if the compression rate in the bit rate reduction coding circuit 21 is 1/3.37, becomes (16 block×8 bytes×4)/3.37= 151.9287≈152 bytes. 12 bytes of inner code parity-check codes are added in the lateral direction. That is, 12 bytes of inner code parity-check codes, for example, Reed-Solomon codes, are added to 152 bytes of data in the lateral direction to give a total of 164 bytes.

In each channel, outer codes and inner codes are added in block units for the 4080 blocks of the luminance signals Y and the 2040 blocks each of the first chrominance signals $P_B$ and the second chrominance signals $P_R$ or the total 8160 blocks.

In the example of the configuration shown in FIG. 6, the 8160 blocks of video signals are provided with product codes comprised of the 12 bytes of outer code parity-check codes added to the 68 bytes of video signals in the outer code (longitudinal) direction (total 80 bytes in longitudinal direction) and 12 bytes of inner code parity-check codes added to the 152 bytes of video signals compressed in the inner code direction (total 164 bytes in the lateral direction).

The grounds for providing 12 bytes of outer code parity-check codes will be explained below.

If 68 bytes+12 bytes=80 bytes of data in the outer code direction are distributed equally among 16 tracks, the result is 80 bytes/16 tracks=5 bytes/track. Accordingly, 5 bytes of outer code parity-check codes are required for correcting one track of errors. This embodiment enables correction of errors not only for one track, but also for two tracks simultaneously. 10 bytes of outer code parity-check codes are required for correcting two tracks of errors. In this embodiment, a safety margin is provided and the number made 12 bytes.

For example, even if one track of data is completely lost at the time of editing, looking at the outer codes for each ECC block, there are only 5 bytes each of error, so the errors can be sufficiently corrected by the addition of 12 bytes of parity-check codes.

Further, even if clogging occurs at one head among the eight heads of the recording head unit 10, two tracks of data are lost. Looking at this in the direction of the outer codes at the ECC blocks, this means 10 bytes of error each, so the errors can be sufficiently corrected by erasure correction by adding 12 bytes of parity-check codes.

In this way, the code length of the outer codes must be made a whole multiple of N when assuming equal distribution among N number of tracks, wherein the number of tracks per field is N. In this case, the total amount of data in the direction of the error correction codes, or 80 bytes, corresponds to five times the number of tracks N=16, since one field's worth of data is recorded on 16 tracks in two turns of the recording head unit 10 illustrated in FIG. 4.

The channel interleave circuit 22 equally divides the 80 bytes of data in the outer code direction among the number of tracks=16 of one field, that is, distributes 5 bytes per track.

The data processed to be given the outer code parity-check codes and inner code parity-check codes and be distributed equally among the 16 tracks in this way are modulated to data series matching the magnetic recording characteristics of the magnetic tape 1 and recording head unit 10 in the modulation circuit 8A. In this example, eight-to-fourteen modulation is performed. The eight-to-fourteen modulated data are amplified at the recording amplification circuit 9 and recorded on the magnetic tape 1 through the recording head unit 10 illustrated in FIG. 4. That is, the recording head unit 10 turns two times to record one field or 16 tracks of data on the magnetic tape 1.

Figure 7:
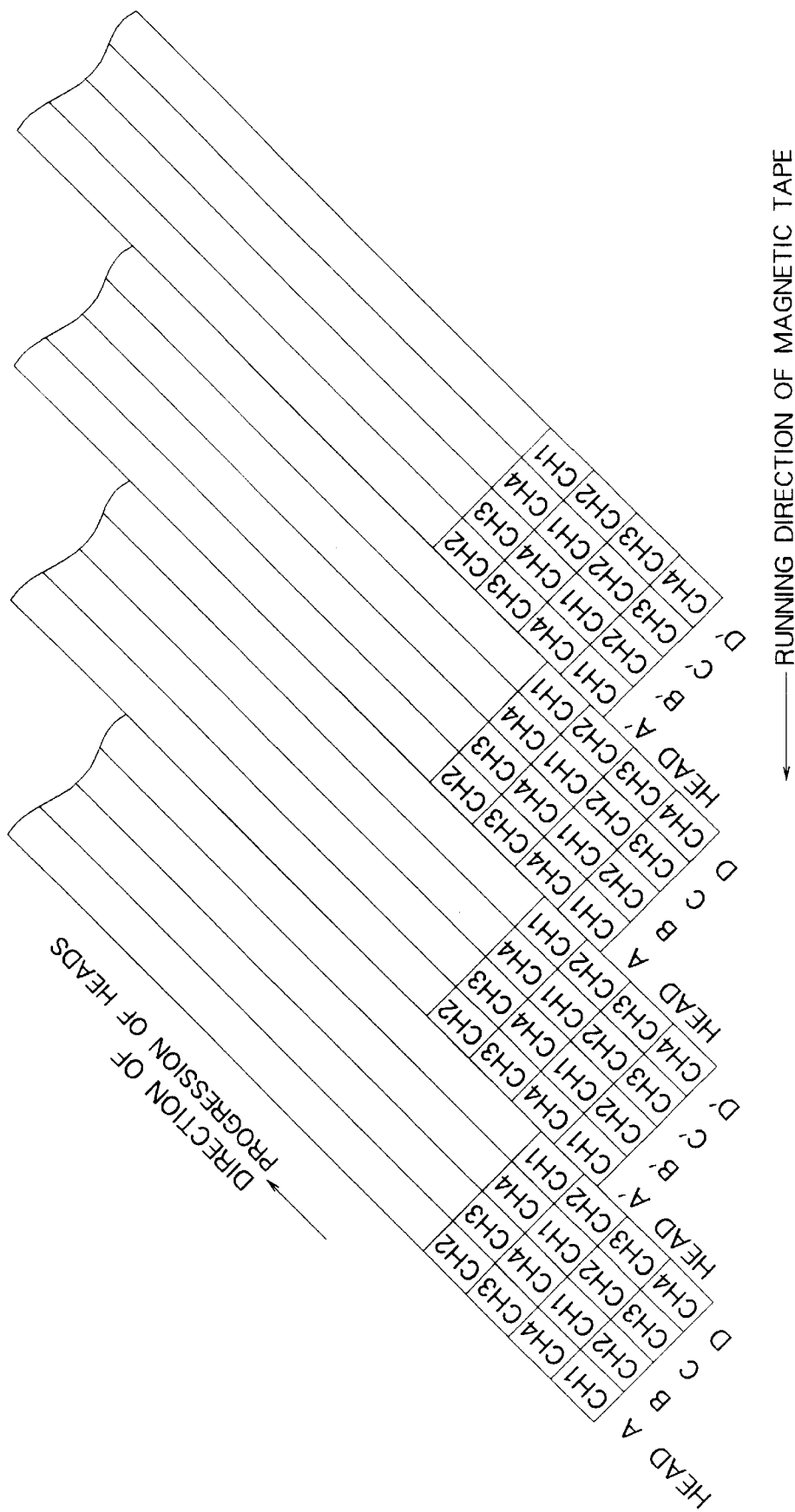
FIG. 7 is a view showing the state of recording signals on a magnetic tape in an embodiment of the present invention.

An example of the format of recording video signals of the data configuration shown in FIG. 6 on a magnetic tape 1 is shown in FIG. 7.

At the first turn of the recording head unit 10, eight tracks of video signals are recorded on the magnetic tape 1 by the heads A, B, C, and D and the heads A', B', C', and D'. The channel data CH1 to CH4 illustrated in FIG. 6 are interleaved at the channel interleave circuit 22 to 5 bytes per track in the direction of progression of the recording head unit 10 and are thus successively equally distributed. Video signals are recorded in the same way as the first turn in the second turn of the recording head unit 10. The recording head unit 10 therefore turns two times to record 16 tracks or one field of video signals on the magnetic tape 1.

Audio signals are recorded along with the video signals, but they are not illustrated. Note that audio signals can be recorded along the direction of progression of the recording head unit 10 at an intermediate position of the magnetic tape 1 or at the edges of the magnetic tape 1 etc. In FIG. 7, illustration of the guard bands etc. are omitted.

The operation of the reproduction system of a digital VTR illustrated in FIG. 3B will be explained below.

The reproduction head unit 11 reads the above-mentioned data recorded on the magnetic tape 1. The reproduction amplification circuit 12 amplifies the read data and, if necessary, performs waveform equalization.

The demodulation circuit 13A performs demodulation opposite to the modulation at the modulation circuit 8A to restore the data sequences to the state before modulation by the modulation circuit 8A.

The operations of the block inner code decoding circuit 14A, the channel deinterleave circuit 23, and the block outer code decoding circuit 16A will be explained below.

The block inner code decoding circuit 14A performs a first stage of error correction in block units using the inner codes added at the block inner code ECC circuit 7A.

The channel deinterleave circuit 23 restores the data divided and distributed among the tracks to the original state.

The block outer code decoding circuit 16A performs a second stage of error correction in block units using the outer codes added at the block outer code ECC circuit 4A.

In the case of the outer code parity-check codes, as explained above, 12 bytes of parity-check codes are added to 68 bytes of data. In this embodiment, in the case of a number of tracks N=16, $$1/N \text{ tracks} = 1/16 \text{ track} = 0.0625 < (12 \text{ bytes}/80 \text{ bytes} =) 0.15$$

Accordingly, for example, in the case of burst errors, even if 15 percent of 16 tracks or one field of data is lost, the lost data can be restored by the error correction. As a result, this is sufficient for error correction in track units in the case of the narrow tracks explained with reference to FIG. 2. That is, according to this embodiment, by adding outer code parity-check codes, powerful error correction can be realized.

The 80 bytes of data in the outer code direction are distributed equally among 16 tracks by the channel interleave circuit 22 to give 5 bytes per track. Accordingly, even if one track of data is completely lost at the time of editing, looking at the outer codes for each ECC block, this gives an error of 5 bytes each, so the errors can be sufficiently corrected by the addition of 12 bytes of parity-check codes.

Further, as explained above, even if clogging occurs at one head among the eight heads of the recording head unit 10, two tracks of data are lost. Looking at this in the outer code direction of each ECC block, this means 10 bytes of error each, so the errors can be sufficiently corrected by erasure correction by adding 12 bytes of parity-check codes.

Note that erasure correction is one method of error correction in the case where the locations (bytes) where the errors exist are known in advance. In general, correction of the same number of bytes of data as the added parity bytes is possible.

As explained above, in this embodiment, the Reed-Solomon configuration of product codes is adopted, so error flags are set for all errors which cannot be corrected by the inner codes and erasure correction is performed by the outer codes.

The bit rate reduction decoding circuit 24 performs image expansion processing opposite to the bit rate reduction coding circuit 21 on the error-corrected data.

The block deshuffling circuit 15A performs processing opposite to the shuffling performed at the block shuffling circuit 5A to reverse the rearrangement of the block units of data.

The error concealment circuit 17A performs error concealment for blocks not able to be corrected by the error correction mentioned above and remaining as erroneous.

When the reproduced video signals are to be output in an analog format, the output data of the error concealment circuit 17A are converted to an analog format by the D/A converter 18.

The recording system of the digital VTR shown in FIG. 3A is illustrated with reference to the recording system of the VTR illustrated in FIG. 1A. The reproduction system of the digital VTR shown in FIG. 3B is illustrated with reference to the reproduction system of the VTR illustrated in FIG. 1B.

The video signals, however, are shown as the luminance signals Y, first chrominance signals $P_B$, and second chrominance signals $P_R$, so more detailed circuit configurations are provided in FIG. 8A and FIG. 8B.

FIG. 8A is a more detailed view of the circuit configuration of the recording system of the digital VTR shown in FIG. 3A, while FIG. 8B is a more detailed view of the circuit configuration of the reproduction system of the digital VTR shown in FIG. 3B.

The configuration and operation of the recording system of the high definition digital VTR of FIG. 8A will be explained in brief below with reference to FIG. 3A considering the case of the recording head unit 10 illustrated in FIG. 4.

The luminance signals Y, first chrominance signals $P_B$, and second chrominance signals $P_R$ of the recording high definition analog video signals are supplied to the input terminals 101, 102, and 103.

The A/D converter 3 is provided with a matrix circuit 30, a first analog/digital converter (A/D) 31, a second A/D converter 32, and a third A/D converter 33. The luminance signals Y, the first chrominance signals $P_B$, and the second chrominance signals $P_R$ are matrix processed at the matrix circuit 30, are converted to digital format video signals at the A/D converter 31 to A/D converter 33, and are supplied to the block shuffling circuit 5A. The luminance signals Y are sampled and quantized at a frequency of 74.25 MHz, while the first chrominance signals $P_B$ and second chrominance signals $P_R$ are sampled and quantized at half of the frequency of the luminance signals Y, that is, a frequency of 37.125 MHz. The luminance signals Y, the first chrominance signals $P_B$, and the second chrominance signals $P_R$ are quantized to 8-bit digital video signals. The quantized first chrominance signals $P_B$ and second chrominance signals $P_R$ are alternately input to the block shuffling circuit 5A. Accordingly, two channels of digital video signals are output from the A/D converter 3. The frequency of the video signals is 74.25 MHz.

The recording high definition digital video signals are supplied to the input terminal 104 and supplied through the digital video signal processing circuit 112 to the block shuffling circuit 5A as two channels of video signals the same as the output from the A/D converter 3.

The block shuffling circuit 5A processes the two channels of video signals from the A/D converter 3 and rearranges them into four channels of video signals by mixing one field's worth of 32,640 blocks of luminance signals Y and first chrominance signals $P_B$ and second chrominance signals $P_R$ shown in FIG. 5 in the case of video signals comprised of blocks of 8 samples×8 lines. One channel of video signals comprises 32,640 blocks/4 channels=8160 blocks. The video signals of each channel are 8-bit signals. Since two channels of video signals of frequencies of 74.25 MHz are output as four channels of shuffled video signals, the frequency of the video signals output from the block shuffling circuit 5A becomes 74.25 MHz/4=18.5625 MHz. The configuration of the four channels of video signals is shown in FIG. 9.

The configuration of the video signals illustrated in FIG. 9, that is, the format where the inner codes and outer codes are configured as product codes, corresponds to that illustrated in FIG. 6, but FIG. 6 showed the case where the outer codes (parity-check codes) were disposed in a group of 12 bytes at the bottom. The format illustrated in FIG. 9 divides the 68 bytes of video data in the longitudinal direction into four and adds 3 bytes of outer code parity-check codes to each 17 bytes of the video data.

The 60 ECC blocks per channel, or total 240 ECC blocks for all channels, of data shown in FIG. 9 constitute one field's worth of data. The recording head unit 10 turns twice to record these data on the magnetic tape 1.

Accordingly, the tracks 1 to 4 of data are recorded on the magnetic tape 1 by the heads A, B, C, and D in the first turn of the recording head unit 10, and the tracks 5 to 8 of data are recorded on the magnetic tape 1 by the heads A', B', C', and D' of the first turn of the recording head unit 10. Next, the tracks 9 to 12 of data are recorded on the magnetic tape 1 by the heads A, B, C, and D of the second turn of the recording head unit 10 and the tracks 13 to 16 of data are recorded on the magnetic tape 1 by the heads A', B', C', and D' of the second turn of the recording head unit 10 . Details of this recording processing are explained later with reference to FIG. 10 and FIG. 11.

The block shuffling circuit 5A illustrated in FIG. 8A preferably, as shown in FIG. 9, performs channel shuffling among the tracks (heads). This examples shows the case of shuffling among 16 tracks.

The bit rate reduction coding circuit 21 encodes the results of shuffling in block units at the block shuffling circuit 5A at a compression rate of 1/3.37.

The bit rate reduction coding circuit 21 is provided with a first stage of eight bit rate reduction encoders BR1 and a second stage of two bit rate reduction encoders BR2. The first stage of eight bit rate reduction encoders BR1 compress block-shuffled video signals of frequencies of 18.5625 MHz and output video signals of frequencies of 6.91548 MHz. The second stage two bit rate reduction encoders BR2 further perform image compression. Each bit rate reduction encoder BR2 of the second stage receives as input four channels of video signals of frequencies of 6.91548 MHz and outputs two channels of image-compressed video signals, so the frequency of the video signals of each channel is 6.91548 MHz×2=13.83096 MHz. The video signals of each channel are comprised of 8 bits.

The block outer code ECC circuit 4A is provided with four outer code encoders for adding error correction code parity-check codes to the four channels of video signals from the bit rate reduction coding circuit 21. The CPU 114 computes the block outer code parity-check codes and the block outer code ECC circuit 4A adds the results of the computation to the video signals.

FIG. 10 shows the configuration (format) of the data relating to the tracks 1 to 4 shown in FIG. 9 to which the outer code parity-check codes have been added in the case of the channel 1. The channels 2 to 4 have similar formats as the above.

There are 15 synchronization blocks in the lateral direction. In the longitudinal direction, there are two bytes of outer code parity-check codes at the top two rows and one byte of outer code parity-check codes at the bottom two rows. Between these outer code parity-check codes, 17 bytes of data are arranged. In each ECC block, the symbols at the top row indicate the channels A, B, C, and D and the serial number. In this example, channel distribution is performed to give 5 bytes/track, so the channel changes among A, B, C, and D every five bytes.

The symbols at the bottom rows of the ECC blocks indicate the data or the outer code parity-check codes distributed at the channel. The symbols P1-1 to P1-5 show the first to fifth outer code parity-check codes of the channel 1. Similarly, the symbols D1-1 to D1-5 show the first to fifth data of the channel 1.

The channel interleave circuit 22 performs channel distribution equally on the data to which the outer code parity-check codes have been added.

Figure 11:
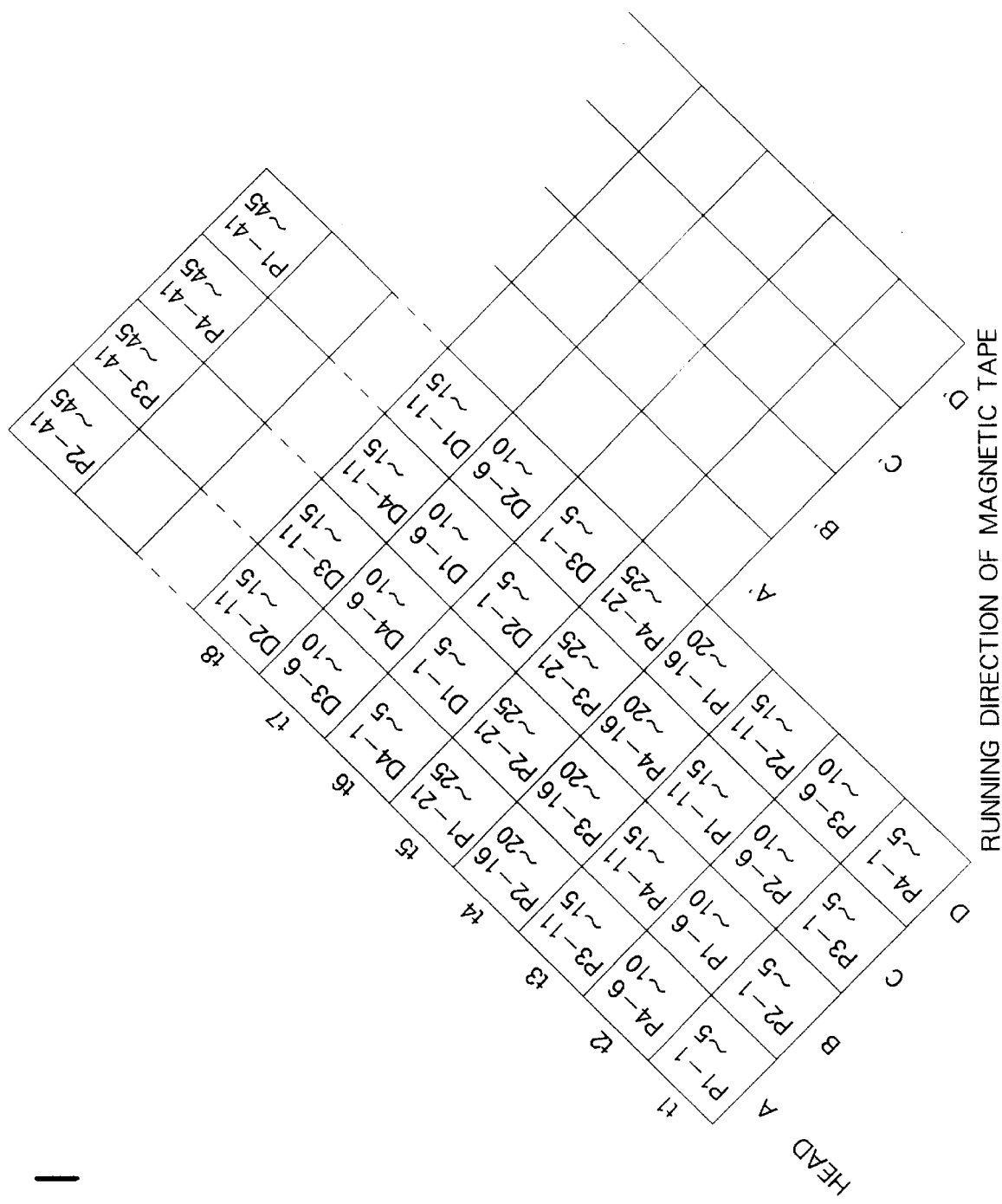
FIG. 11 is a view showing the state of recording on a magnetic tape signals distributed over channels in a channel interleave circuit.

FIG. 11 shows an example of recording of data on a magnetic tape 1 after channel distribution of the signals shown in FIG. 10. The channel distribution is performed to give 5 bytes/track. The channel distribution for the tracks 1 to 4 will be explained in detail below.

First recording timing t1

The channel interleave circuit 22 performs channel distribution so that the outer code parity-check codes P1-1 to P1-5 of the channel 1 shown in FIG. 10 are recorded on the magnetic tape 1 from the head A, the outer code parity-check codes P2-1 to P2-5 of the channel 2 are recorded from the head B, the outer code parity-check codes P3-1 to P3-5 of the channel 3 are recorded from the head C, and the outer code parity-check codes P4-1 to P4-5 of the channel 4 are recorded from the head D. That is, at that point of time, the channel interleave circuit 22 substantially does not perform channel distribution.

Second recording timing t2

The channel interleave circuit 22 performs channel distribution so that the outer code parity-check codes P1-6 to P1-10 of the channel 1 shown in FIG. 10 are recorded on the magnetic tape 1 from the head B, the outer code parity-check codes P2-6 to P2-10 of the channel 2 are recorded from the head C, the outer code parity-check codes P3-6 to P3-10 of the channel 3 are recorded from the head D, and the outer code parity-check codes P4-6 to P4-10 of the channel 4 are recorded from the head A. That is, at that point of time, the channel interleave circuit 22 performs channel interleaving shifted by exactly one channel.

That is, at the timing t1, the parity-check codes P1-1 to P1-5 of the channel 1 are recorded from the head A on the magnetic tape 1, but at the timing t2, the parity-check codes P1-6 to P1-10 are recorded on the magnetic tape 1 from the head B, i.e., are shifted by one channel. The same is true for the parity-check codes of the other channels.

Recording timing t3 to t8

After this, in the same way, the channel interleave circuit 22 successively shifts the channels one by one.

The channel interleave circuit 22 distributes the data in the same way as above among the channels.

Next, the channel interleave circuit 22 performs channel distribution on the outer code parity-check codes of the lower 1 byte shown in FIG. 10.

Referring to FIG. 11, parity-check codes are positioned at the two ends of the magnetic tape 1. In general, data loss or error occurs more frequently at the ends of the magnetic tape 1 rather than the center of the magnetic tape 1. As illustrated in FIG. 11, by recording the data at the center of the magnetic tape 1, the error or loss of the data themselves is reduced. That is, as illustrated in FIG. 10, the outer code parity-check codes are disposed dispersed at the top and bottom so as to reduce to a minimum the error or loss of the data themselves.

In the above, the explanation was made of the channel distribution and recording for the tracks 1 to 4 illustrated in FIG. 10, but channel distribution and recording may also be performed in the same way for the signals of the tracks 5 to 8, the signals of the tracks 9 to 12, and the signals of the tracks 13 to 16. That is, the signals of the tracks 5 to 8 are recorded by the heads A', B', C', and D' of the recording head unit 10 on the magnetic tape 1 in the first turn of the recording head unit 10. The signals of the tracks 9 to 12 are recorded by the heads A, B, C, and D of the recording head unit 10 and the signals of the tracks 13 to 16 are recorded by the heads A', B', C', and D' of the recording heads unit 10 on the magnetic tape 1 in the second turn of the recording head unit 10.

As explained above, the outer code parity-check codes are recorded distributed substantially uniformly among the channels.

Consider the error correcting ability in this case. For example, when a track 1 is completely defective at the time of editing, since there are five synchronization blocks in the channel A distributed in one row shown in FIG. 9, repair is possible with 12 parity-check codes. Further, even when any two tracks of data in the 16 tracks are lost, 10 pieces of data are lost in each ECC block, so the data can be repaired by 10 parity-check codes. In this embodiment, a safety margin is given and use is made of 12 bytes of parity-check codes.

That is, generally speaking, in a digital VTR which records and reproduces image data by a plurality of heads, by constructing the ECCs so as to enable correction of errors for a number of tracks equal to or greater than the number of tracks to be recorded by one head per field, it is possible to restore image data by error correction even in the case where one head clogs.

Note that in a VTR, audio signals are recorded in addition to the video signals. The audio signals AUDIO are supplied through an audio signal processing circuit 116 to a channel interleave circuit 22 where they are interleaved together with the video signals.

The block inner code ECC circuit 7A adds inner codes to the four channels of video signals and audio signal AUDIO interleaved at the channel interleave circuit 22, so has four inner code encoders.

The modulation circuit 8A also has four modulators MOD for modulating the four channels of video signals and audio signals AUDIO. The modulated output of each of these modulators MOD consists of 4 bits of 13.83095 MHz frequency.

After the modulation circuit 8A, provision is made of four parallel/serial converters. These parallel/serial converters convert 4-bit video signals into 1-bit video signals and output the results to the four heads of the recording head 10. The frequency of the 1-bit video signals output from these parallel/serial converters is 193.6 MHz.

The processing by the synchronization signal and ID signal adding circuit 6A illustrated in FIG. 3A is realized in the configuration illustrated in FIG. 5 by the synchronization signal generating circuit 112 generating synchronization signals and by the synchronization signals and indexes (ID) being added to the video signals in the channel interleave circuit 22 along with the processing of the audio signals from the audio signal processing circuit 116.

FIG. 8 does not show the recording amplification circuit 9 illustrated in FIG. 3A.

An explanation will be made below of the reproduction system of a high definition digital VTR.

After the reproduction head 11, provision is made of four serial/parallel converters. Each of these serial/parallel converters converts the 1-bit 193.6 MHz video signals read out from the reproduction head unit 11 into 4-bit 13.63098 MHz video signals.

The demodulation circuit 13A is comprised of four demodulators DEMOD. Each of the demodulators DEMOD performs demodulation to restore the video signals to the state before the modulation by the modulation circuit 8A.

After the demodulation circuit 13A, there are provided four time base correctors TBC, not shown in FIG. 3B. Each of these time base correctors TBC corrects the time axis error (fluctuations) of the VTR. Each of the time base correctors TBC outputs 8-bit 13.63098 MHz video signals.

After the four time base correctors TBC, there are provided four inner code decoders serving as the block inner code decoding circuit 14A. The video signals with the decoded inner codes are supplied to the channel deinterleave circuit 23.

The block outer code decoding circuit 16A is also comprised of four outer code decoders.

The bit rate reduction decoding circuit 24 is comprised of four bit reduction circuits. Each of the bit reduction circuits of the bit reduction decoding circuit 24 outputs two channels of 8-bit, 18.5625 MHz frequency signals. The bit rate reduction decoding circuit 24 outputs a total of 8 channels of video signals.

The block deshuffling circuit 15A returns the 8 channels of video signals to the state before the shuffling at the block shuffling circuit 5A.

After the block deshuffling circuit 15A, there are provided four error concealment circuits serving as the error concealment circuit 17. The error concealment circuit 17 outputs 8 channels of video signals of 8 bits and frequencies of 18.5625 MHz.

After the error concealment circuit 17, provision is made of a parallel/serial conversion circuit 212, not illustrated in FIG. 3B. This parallel/serial conversion circuit 212 converts the 8 channels of video signals of 8 bits and frequencies of 18.5625 MHz to two channels of video signals. These video signals are of 8 bits and frequencies of 74.25 MHz.

The D/A converter 18 is comprised of three digital/analog converters (D/A) 181, 182, and 183 and a matrix circuit 180. The first D/A converter 181 converts the luminance signals Y. The second D/A converter 182 converts the first chrominance signals $P_B$, and the third D/A converter converts the second chrominance signals $P_R$. The first chrominance signals $P_B$, the audio signals AUDIO, and the second chrominance signals $P_R$ have frequencies half of that of the luminance signals Y, so are supplied to the matrix circuit 180 at alternate timings. The analog luminance signals Y, first chrominance signals $P_B$, and second chrominance signals $P_R$ from the D/A converter 18 are output from the output terminals 201 to 103.

The digital reproduction video signals are output through the processing circuit 220 from the output terminal 204.

The reproduction audio signals are taken out from the channel deinterleave circuit 23 and the reproduced audio signals AUDIO are output through the audio signal processing circuit 21.

The block outer code decoding circuit 16A works with the CPU 214 and decodes the outer codes for each block.

The signal generating circuit 218 generates the synchronization signals.

According to the present invention, the burst error correcting ability is greatly improved and the probability of error concealment processing is reduced. Therefore, it is possible to obtain reproduced image data with a high reliability without increasing the load of error concealment processing.

Further, according to the present invention, error correction becomes possible even with track units of lost data, a greater margin is created in timing at the time of editing, and the load on the mechanical system and servo system of the digital VTR can be reduced. As a result, it is possible to improve the reliability of the VTR.

Further, according to the present invention, by constructing the ECC so as to enable correction of errors for a number of tracks equal to or greater than the number of tracks on which signals are recorded by a single head per field in a digital VTR recording and reproducing image data by a plurality of heads, it is possible to restore image data by error correction even in the case of clogging of a head.

The above embodiment was explained with reference to high definition video signals, but the present invention is not limited to video signals. The error correction processing can be performed in the same way as the above on audio signals as well.

In the above embodiment, the explanation was made of the case of 8 samples×8 lines 1=64 video image signals as one block, but the pixel configuration of the blocks was just an example. The present invention is not limited to the block configuration illustrated.

Further, illustration was made of the case of application of luminance signals Y, first chrominance signals $P_B$, and second chrominance signals $P_R$ as component video signals, but the present invention can also be applied in the same way to the case of use of component video signals of R, G, and B signals.

The configuration of the recording head unit 10 shown in FIG. 4, further, where the head unit rotates at 120 Hz, provision was made of four heads A, B, C, and D of a first group and heads A', B', C', and D' of a second group near to the heads A, B, C, and D of the first group but a predetermined distance away, that is, a total of eight heads, the tape was wound at a 180 degree angle, and one field of video signals was recorded by two turns was an illustration. The present invention is not limited to the above-mentioned disposition of heads. Further, it is not limited to this 8-head configuration. The invention may of course be applied even in cases of use of any other number of heads, for example, four heads.

Further, illustration was made of a high definition digital VTR as a preferable embodiment of the present invention, but the error correction processing of the present invention may be applied to digital VTRs other than high definition ones, of course, and also to various types of error correction coding processing in general which configure the inner codes and outer codes serving as the error correction codes as product codes and disperse the outer codes out of the error correction codes added doubly to the data among one processing unit's worth of a plurality of sequences of data.

INDUSTRIAL APPLICABILITY

The error correction processing method and apparatus of the present invention may be used for improving the error correcting ability in signal processing of digital video signal recording and reproduction apparatuses which record and reproduce video signals at a high density in block units.

We claim:

1. A digital data error correction coding apparatus which performs error correction coding of digital data using inner codes and outer codes constituting product codes, wherein said digital data is arranged in groups of bytes, each group including a multiple of data bytes and at least one outer error code byte, and wherein each said group of bytes is distributed amongst a plurality of recording medium tracks, said digital data coding apparatus comprising:
 block shuffling means (5A) for shuffling the data every block comprised of (m×n) number of data so as to disperse the effects of errors occurring in said data;
 block outer code adding means (4A) for adding said at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one;
 channel data dispersion means (22) for dispersing said data to which the outer codes have been added among a plurality of channels; and
 block inner code adding means (7A) for adding inner codes for every block of said dispersed data.

2. A digital data error correction coding apparatus as set forth in claim 1, wherein
 between said block shuffling means and said block outer code adding means, there is provided a bit rate reduction means (21) for compressing by a predetermined compression rate said data shuffled in blocks.

3. A digital data error correction decoding apparatus which decodes digital data arranged in groups of bytes, each group including a multiple of data bytes and at least one error code byte, and wherein each said group of bytes is distributed amongst a plurality of recording medium tracks, said groups of bytes being generated by (i) shuffling (m×n)

sized blocks of data to generate shuffled blocks, (ii) adding said at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one, (iii) dispersing said data to which said outer codes have been added among a plurality of channels, and (iv) adding inner codes for every block of said dispersed data, said digital data error correction decoding apparatus comprising:
a block inner code decoding means (14A) for decoding every block of said coded data using inner codes;
a channel dispersion reversing means (23) for reversing the channel dispersion of said data decoded using said inner codes;
a block outer code decoding means (16A) for decoding every block of said channel-restored data using said outer codes;
a block deshuffling means (15A) for restoring every block of said data decoded using said outer codes to the state before the shuffling; and
an error concealment means (17) for concealing the errors which cannot be corrected by said block inner code decoding means and said block outer code decoding means by referring to the surrounding data.

4. A digital data error correction decoding apparatus as set forth in claim 3, wherein
between said block outer code decoding means and said block deshuffling means, there is provided a bit rate reduction decoding means (24) for restoring the data decoded in blocks by the outer codes by a predetermined compression rate; and
said block deshuffling means deshuffles every block of said data restored at the bit rate reduction decoding means.

5. A digital data error correction coding and decoding system comprising:
a digital data error correction coding apparatus which performs error correction coding of digital data using inner codes and outer codes constituting product codes, wherein said digital data is arranged in groups of bytes, each group including a multiple of data bytes and at least one outer error code byte, and wherein each said group of bytes is distributed amongst a plurality of recording medium tracks, said data coding apparatus including
a block shuffling means (5A) for shuffling the data every block comprised of (m×n) number of data so as to disperse the effects of errors occurring in said data,
a block outer code adding means (4A) for adding at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one,
a channel data dispersion means (22) for dispersing said data to which said outer codes have been added among a plurality of channels, and
a block inner code adding means (7A) for adding inner codes for every block of said dispersed data and
a digital data error correction decoding apparatus which decodes by error correcting the data obtained by coding in said digital data error correction coding apparatus, said digital data error correction decoding apparatus including
a block inner code decoding means (14A) for decoding every block of said coded data using inner codes,
a channel dispersion reversing means (23) for reversing the channel dispersion of said data decoded using said inner codes,
a block outer code decoding means (16A) for decoding every block of said channel restored data using said outer codes,
a block deshuffling means (15A) for restoring every block of said data decoded using said outer codes to the state before said shuffling, and
an error concealment means (17) for concealing the errors which cannot be corrected by the block inner code decoding means and said block outer code decoding means by referring to the surrounding data.

6. A digital data error correction coding method which performs error correction coding of digital data using inner codes and outer codes constituting product codes, wherein said digital data is arranged in groups of bytes, each group including a multiple of data bytes and at least one outer error code byte, and wherein each said group of bytes is distributed amongst a plurality of recording medium tracks, said digital data coding method including the following steps:
a block shuffling step of shuffling the data every block comprised of (m×n) number of data so as to disperse the effects of errors occurring in the data;
a block outer code adding step of adding at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one;
a channel data dispersion step of dispersing said data to which said outer codes have been added to among a plurality of channels; and
a block inner code adding step of adding inner codes for every block of said dispersed data.

7. A digital data error correction coding method as set forth in claim 6, wherein
after said block shuffling step, there is provided a bit rate reduction step of compressing by a predetermined compression rate the data shuffled in blocks.

8. A digital data error correction decoding method which decodes digital data arranged in groups of bytes, each group including a multiple of data bytes and at least one error code byte, and wherein each said group of bytes is distributed amongst a plurality of recording medium tracks, said groups of bytes being generated by (i) shuffling (m×n) sized blocks of data to generate shuffled blocks, (ii) adding said at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one, (iii) dispersing the data to which the outer codes have been added among a plurality of channels, and (iv) adding inner codes for every block of the dispersed data, said digital data error correction decoding method including the following steps:
a block inner code decoding step of decoding every block of the coded data using inner codes, a channel dispersion reversing step for reversing the channel dispersion of said data decoded using said inner codes;

a block outer code decoding step of decoding every block of said channel restored data using said outer codes;

a block deshuffling step of restoring every block of said data decoded using said outer codes to the state before said shuffling, and an error concealment step of concealing the errors which cannot be corrected at said block inner code decoding step and said block outer code decoding step by referring to the surrounding data.

9. A digital data error correction decoding method as set forth in claim 8, wherein after the block outer code decoding step, there is provided a bit rate reduction decoding step of restoring said data decoded in blocks by said outer code by a predetermined compression rate; and in said block deshuffling step, every block of said data restored at said bit rate reduction decoding step is deshuffled.

10. A digital data recording apparatus which performs error correction coding of digital data using inner codes and outer codes constituting product codes and records the result on a recording medium, wherein said digital data is arranged in groups of bytes, each group including a multiple of data bytes and at least one outer error code byte, and wherein each said group of bytes is distributed amongst a plurality of recording medium tracks, said digital data recording apparatus comprising:

a block shuffling means (5A) for shuffling the data every block comprised of (m×n) number of data so as to disperse the effects of errors occurring in the data;

a block outer code adding means (4A) for adding at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one;

a channel data dispersion means (22) for dispersing said data to which said outer codes have been added among a plurality of channels;

a block inner code adding means (7A) for adding inner codes for every block of said dispersed data; and a means (8A, 10) for recording said data to which said inner codes have been added on said recording medium (1).

11. A digital data recording apparatus as set forth in claim 10, wherein between said block shuffling means and said block outer code adding means, there is provided a bit rate reduction means (21) for compressing by a predetermined compression rate the data shuffled in blocks.

12. A digital data recording apparatus as set forth in claim 10, wherein said recording medium comprises a magnetic tape; and said recording means has a modulation means and magnetic head unit.

13. A digital data recording apparatus as set forth in claim 12, wherein said outer codes are disposed at the two ends of the data so that said outer codes are recorded at the ends of said magnetic tape and said data are recorded at the center of said magnetic tape.

14. A digital data recording apparatus as set forth in claim 12, wherein said magnetic head unit comprise $\underline{n}$ number of first heads disposed at equal intervals and $\underline{n}$ number of additional heads disposed close to said first heads, said magnetic head unit is formed so as to turn two times to record one field of data on said magnetic tape; and said number N of tracks is defined as N=4×n.

15. A digital data recording apparatus as set forth in claim 10, wherein said channel dispersion distributes data amongst said channels in substantially equal amounts.

16. A digital data recording apparatus as set forth in claim 13, wherein said digital data includes data representing high definition video signals.

17. A digital data recording apparatus as set forth in claim 16, wherein said high definition video signals are component signals comprised of three types of video components; and one field's worth of the three types of video components is distributed over $\underline{n}$ number of channels.

18. A digital data reproduction apparatus which reads out from a recording medium and decodes digital data arranged in groups of bytes, each group including a multiple of data bytes and at least one error code byte, and wherein each said group of bytes is distributed amongst a plurality of recording medium tracks, said groups of bytes being generated by (i) shuffling (m×n) sized blocks of data to generate shuffled blocks, (ii) adding said at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one, (iii) dispersing the data to which the outer codes have been added among a plurality of channels, and (iv) adding inner codes for every block of the dispersed data, said digital data reproduction apparatus comprising:

a means (11, 13A) for reading said coded data from said recording medium;

a block inner code decoding means (14A) for decoding every block of said read out data using inner codes;

a channel dispersion reversing means (23) for reversing the channel dispersion of said data decoded using said inner codes;

a block outer code decoding means (16A) for decoding every block of said channel restored data using said outer codes;

a block deshuffling means (15A) for restoring every block of said data decoded using said outer codes to the state before the shuffling; and an error concealment means (17) for concealing the errors which cannot be corrected by said block inner code decoding means and said block outer code decoding means by referring to the surrounding data.

19. A digital data reproduction apparatus as set forth in claim 18, wherein between said block outer code decoding means and said block deshuffling means, there is provided a bit rate reduction decoding means (24) for restoring said data decoded in blocks by said outer codes by a predetermined compression rate; and said block deshuffling means deshuffles every block of said data restored at said bit rate reduction decoding means.

20. A digital data recording and reproduction system comprising:

a digital data recording apparatus which performs error correction coding of digital data using inner codes and outer codes constituting product codes and records the result on a recording medium, wherein said digital data is arranged in groups of bytes, each group including a multiple of data bytes and at least one outer error code byte, and wherein each said group of bytes is distributed amongst a plurality of recording medium tracks, said digital data recording apparatus including

- a block shuffling means (5A) for shuffling the data every block comprised of (m×n) number of data so as to disperse the effects of errors occurring in the data;
- a block outer code adding means (4A) for adding at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one,
- a channel data dispersion means (22) for dispersing said data to which said outer codes have been added among a plurality of channels,
- a block inner code adding means (7A) for adding inner codes for every block of said dispersed data, and
- a means (8A, 10) for recording said data to which said inner codes have been added on said recording medium (1) and
- a digital data reproduction apparatus which reads out from said recording medium and decodes by error correcting the data coded by said digital data error correction recording apparatus and recorded on said recording medium, said digital data reproduction apparatus including
  - a means (11, 13A) for reading said coded data from said recording medium,
  - a block inner code decoding means (14A) for decoding every block of said read out data using inner codes,
  - a channel dispersion reversing means (23) for reversing said channel dispersion of said data decoded using said inner codes,
  - a block outer code decoding means (16A) for decoding every block of said channel restored data using said outer codes,
  - a block deshuffling means (15A) for restoring every block of said data decoded using said outer codes to the state before the shuffling, and
  - an error concealment means (17) for concealing the errors which cannot be corrected by the block inner code decoding means and the block outer code decoding means by referring to the surrounding data.

21. A digital data recording and reproduction apparatus as set forth in claim 20, wherein said recording medium comprises a magnetic tape, said recording means has a modulation means and magnetic head unit, said magnetic head unit comprise $\underline{n}$ number of first heads disposed at equal intervals and $\underline{n}$ number of additional heads disposed close to said first heads, said magnetic head unit is formed so as to turn two times to record one field of data on said magnetic tape, and said number N of tracks is defined as N=4×n.

22. A digital data error correction coding and decoding method which uses inner codes and outer codes as codes for correcting errors in digital data and comprises these inner codes and outer codes as product codes, wherein said digital data is arranged in groups of bytes, each group including a multiple of data bytes and at least one outer error code byte, and wherein each said group of bytes is distributed amongst a plurality of recording medium tracks, said digital data error correction coding and decoding method including the following steps:

a step of adding at least one outer error code byte to each said group of bytes such that when the resulting total number of bytes in said group of bytes is divided by the number of said tracks the quotient is a whole number, and such that the number of added outer error code bytes is a multiple of said whole number, said multiple being greater than or equal to one;

a step of dispersing said added outer codes among N number of channels;

a step of adding inner codes, and a step of correcting errors in the digital data using said added outer codes and inner codes.

23. A digital data error correction coding and decoding method as set forth in claim 22, wherein the digital data is comprised in block units of a size of (n×m), and said error correction coding processing at said error correction step is performed for every block.

24. A digital data error correction coding and decoding method as set forth in claim 22, wherein said error correction step comprises the steps of:

correcting errors in block units using said added inner codes, correcting errors in block units using said added outer codes, and concealing the errors remaining after error correction.

25. A digital data error correction coding and decoding method as set forth in claim 24, further comprising the step of concealing errors remaining after the error correction.

* * * * *